US009894785B2

(12) United States Patent
Furudate et al.

(10) Patent No.: US 9,894,785 B2
(45) Date of Patent: Feb. 13, 2018

(54) CASE STRUCTURE FOR ELECTRONIC CONTROL DEVICE

(71) Applicant: Hitachi Automotive Systems, Ltd., Hitachinaka-shi, Ibaraki (JP)

(72) Inventors: Hitoshi Furudate, Ibaraki (JP); Kiyotaka Kanno, Ibaraki (JP); Yoshio Kawai, Ibaraki (JP); Yoshiyasu Negishi, Ibaraki (JP); Takayuki Fukuzawa, Ibaraki (JP)

(73) Assignee: HITACHI AUTOMOTIVE SYSTEMS, LTD., Hitachinaka-shi (JP)

( * ) Notice: Subject to any disclaimer, the term of this patent is extended or adjusted under 35 U.S.C. 154(b) by 0 days.

(21) Appl. No.: 15/038,608

(22) PCT Filed: Nov. 12, 2014

(86) PCT No.: PCT/JP2014/079901
§ 371 (c)(1),
(2) Date: May 23, 2016

(87) PCT Pub. No.: WO2015/083507
PCT Pub. Date: Jun. 11, 2015

(65) Prior Publication Data
US 2016/0295721 A1 Oct. 6, 2016

(30) Foreign Application Priority Data
Dec. 5, 2013 (JP) .................................. 2013-251608

(51) Int. Cl.
H05K 5/00 (2006.01)
H05K 5/02 (2006.01)
(Continued)

(52) U.S. Cl.
CPC ........... *H05K 5/0217* (2013.01); *B60R 16/02* (2013.01); *F16H 61/0006* (2013.01);
(Continued)

(58) Field of Classification Search
CPC .. H05K 5/0217; H05K 5/0017; H05K 5/0056; H05K 5/0213; H05K 5/0247; B60R 16/02; B60R 16/0239; F16H 61/0006
(Continued)

(56) References Cited

U.S. PATENT DOCUMENTS 6,506,110 B1 * 1/2003 Borisch ................ H05K 5/0213
174/17 VA
6,827,232 B1 * 12/2004 Hara ................ B29C 45/14336
220/371
(Continued)

FOREIGN PATENT DOCUMENTS

JP U 6-82884 11/1994
JP 2006-005162 A 1/2006
(Continued)

OTHER PUBLICATIONS

PCT International Search Report issued in application PCT/JP2014/079901 dated Feb. 24, 2015; 2 pages.
(Continued)

Primary Examiner — Hung S Bui
(74) Attorney, Agent, or Firm — Foley & Lardner LLP

(57) ABSTRACT

Depending on the orientation by which a breathing filter is mounted in a vehicle, water can accumulate in the breathing filter, and prevent the pressure difference between the space inside a case and the outside air from being adjusted; therefore, the vehicular layout is limited. Also, because the filter is formed in the center of the case, electronic parts cannot be installed on substrates on the upper and lower surfaces of the filter, meaning that the substrate size and the case size will increase. In addition, the costs will increase. The structure of the present invention is characterized in that breathing paths are provided on the surfaces sandwiching a portion where a filter film is welded in the corner of a resin-side case of a vehicle-mounted electronic control
(Continued)

device such as an engine control unit or an automatic transmission control unit, and in that the breathing paths are connected inside.

6 Claims, 9 Drawing Sheets

(51) Int. Cl.
*B60R 16/02* (2006.01)
*F16H 61/00* (2006.01)
*B60R 16/023* (2006.01)

(52) U.S. Cl.
CPC ......... *H05K 5/0017* (2013.01); *H05K 5/0056* (2013.01); *H05K 5/0213* (2013.01); *H05K 5/0247* (2013.01); *B60R 16/0239* (2013.01)

(58) Field of Classification Search
USPC .................. 361/728–730, 752, 796, 800
See application file for complete search history.

(56) References Cited

U.S. PATENT DOCUMENTS

| | | | | |
|---|---|---|---|---|
| 7,189,918 B2* | 3/2007 | Sakata | ................ | H05K 5/0213 174/17 VA |
| 7,396,391 B2* | 7/2008 | Waida | ................ | H05K 5/0213 55/385.1 |
| 7,626,129 B2* | 12/2009 | Sasaki | ................ | H05K 5/0213 174/17 VA |
| 8,575,481 B2* | 11/2013 | Hasegawa | ................ | H05K 5/06 174/50.5 |
| 9,516,769 B2* | 12/2016 | Kaneko | ................ | H05K 1/0203 |
| 2007/0134981 A1 | 6/2007 | Shinoda et al. | | |
| 2011/0211311 A1* | 9/2011 | Shinoda | ................ | H05K 5/0047 361/694 |

FOREIGN PATENT DOCUMENTS

| | | |
|---|---|---|
| JP | 2006-049618 A | 2/2006 |
| JP | 2007-189215 A | 7/2007 |
| JP | 2008-211753 A | 9/2008 |
| JP | 2010-052701 A | 3/2010 |
| JP | 2010-278056 | 12/2010 |
| JP | 2011-165748 A | 8/2011 |
| JP | 2013-069736 A | 4/2013 |

OTHER PUBLICATIONS

Japanese Office Action issued in corresponding application No. 2015-551443 dated Jul. 18, 2017.

* cited by examiner

SECTIONAL VIEW TAKEN ALONG LINE E-E

SECTIONAL VIEW TAKEN ALONG LINE F-F

FIG. 4
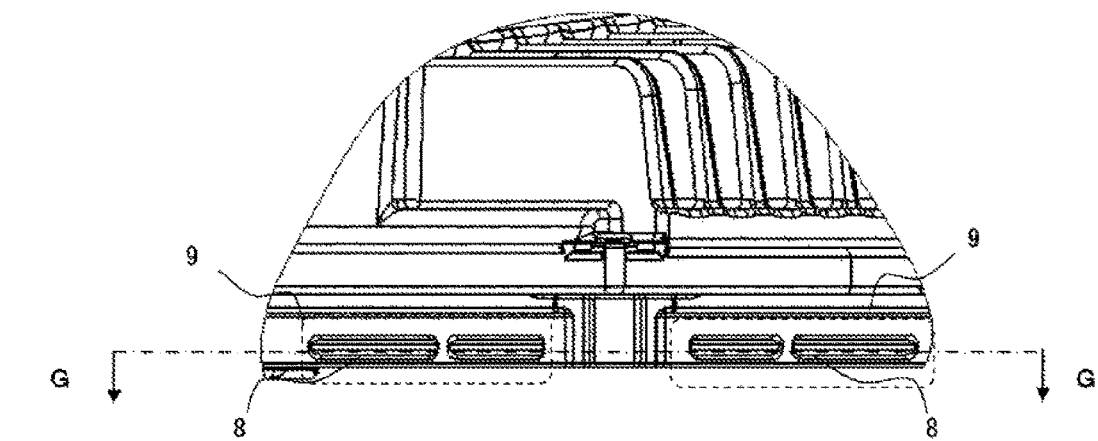
SECTIONAL VIEW
TAKEN ALONG LINE G-G
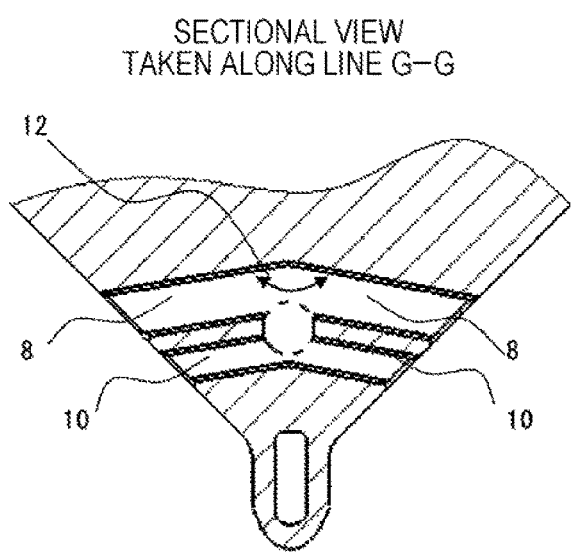

FIG. 5
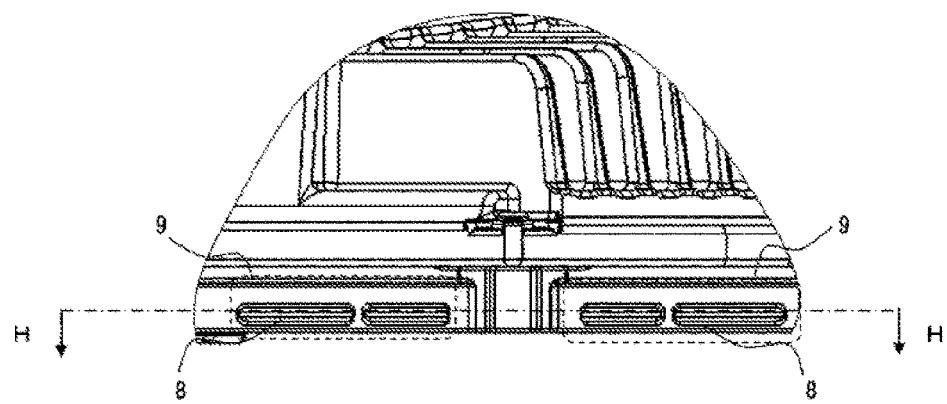
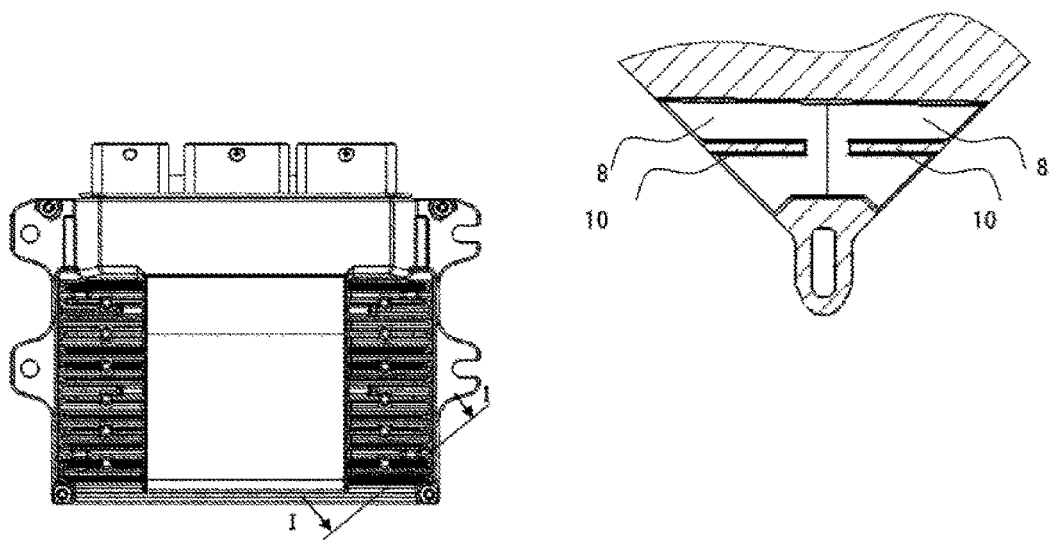
SECTIONAL VIEW
TAKEN ALONG LINE H-H
SECTIONAL VIEW
TAKEN ALONG LINE I-I
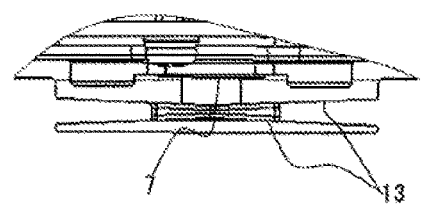

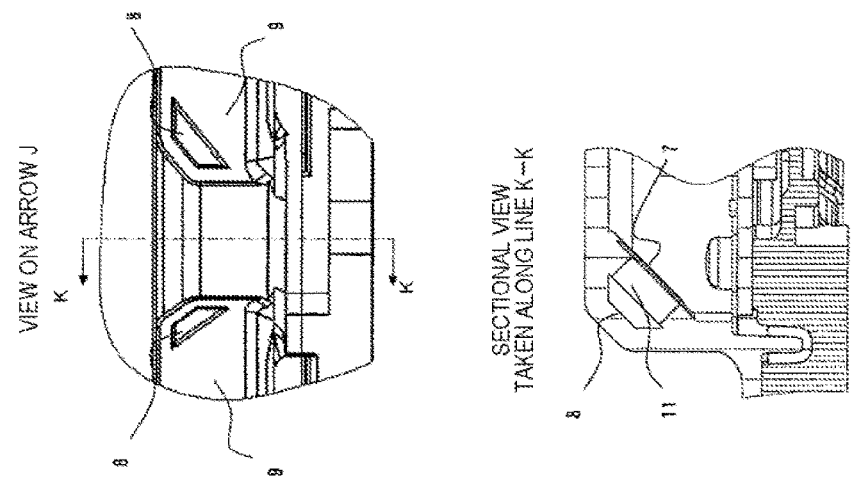
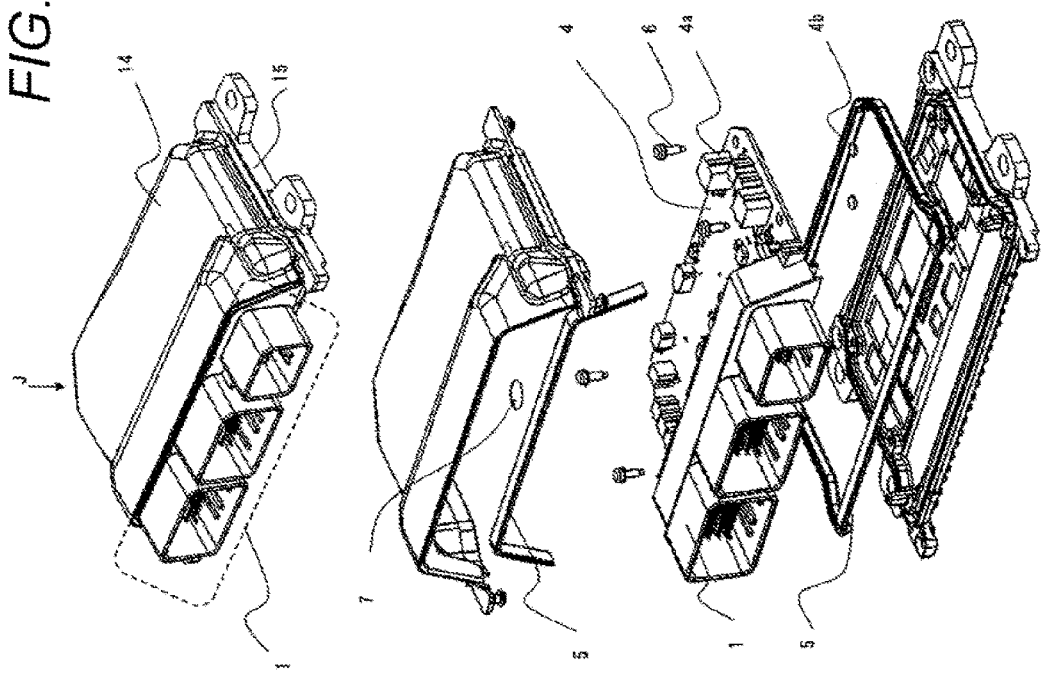
FIG. 6

FIG. 7
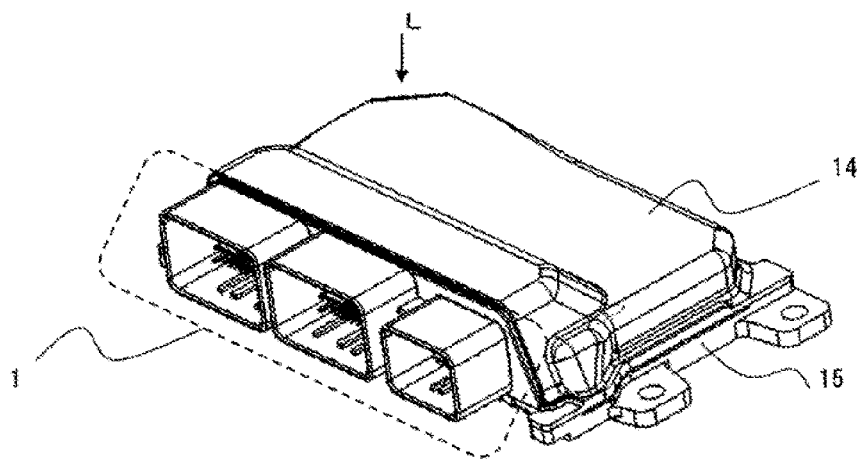
VIEW ON ARROW L
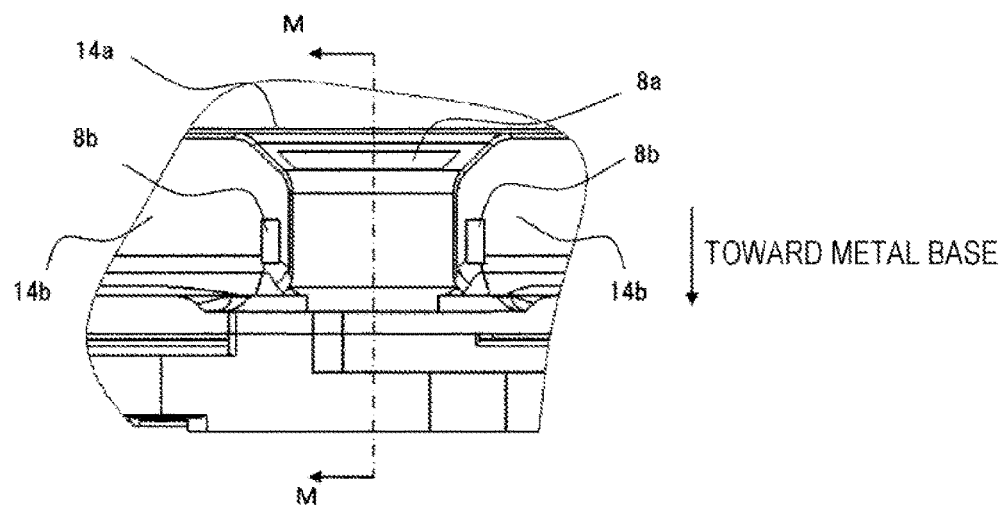
TOWARD METAL BASE
SECTIONAL VIEW
TAKEN ALONG LINE M-M
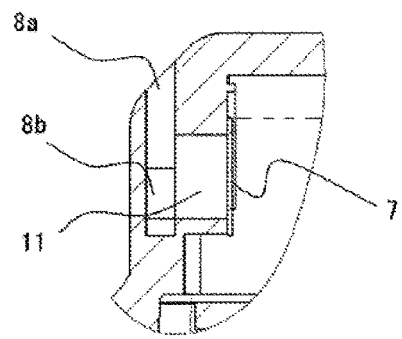

FIG. 8
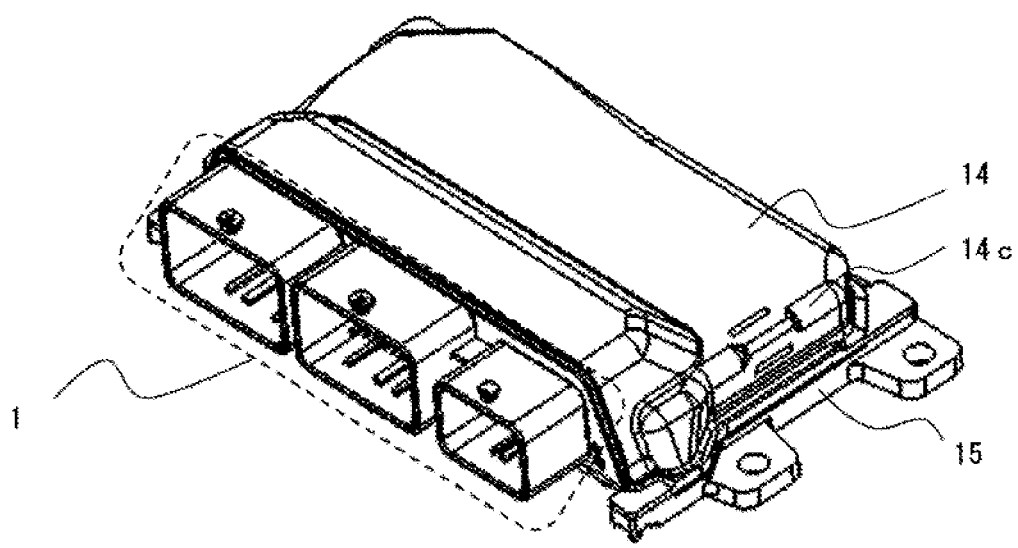
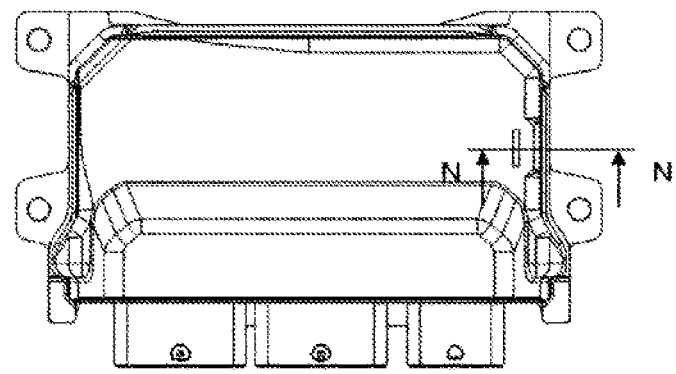
SECTION TAKEN ALONG N-N
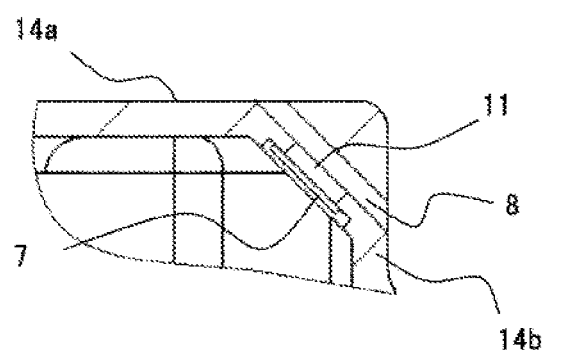

FIG. 9
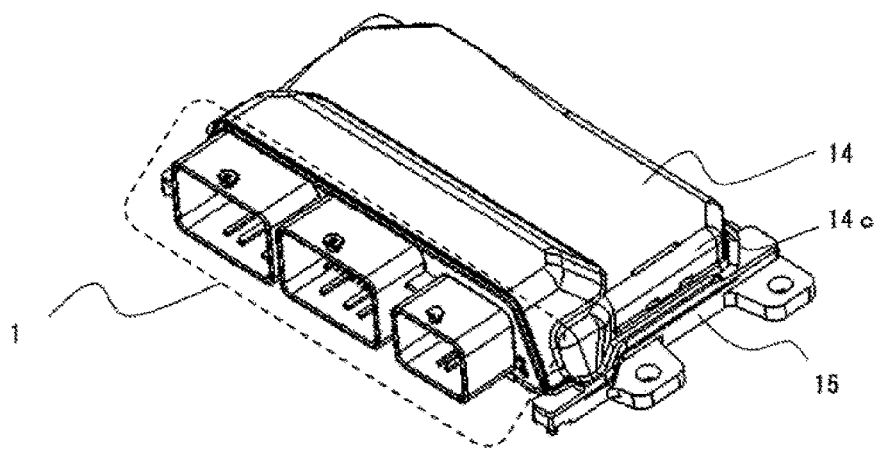
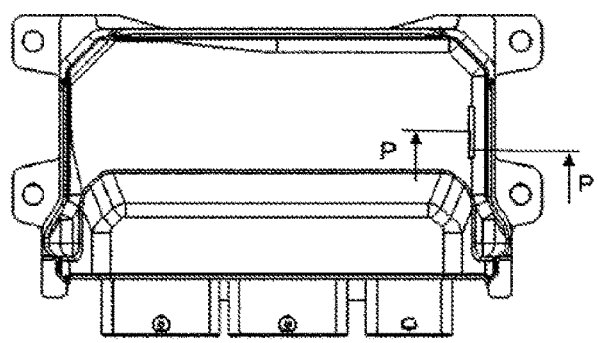
SECTION TAKEN ALONG P–P
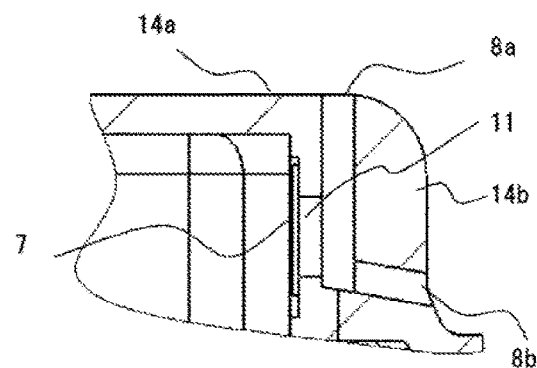

CASE STRUCTURE FOR ELECTRONIC CONTROL DEVICE

TECHNICAL FIELD

The present invention relates to a case structure for an electronic control device mounted on a vehicle, such as an engine control unit or an automatic transmission control unit, which has a waterproof structure provided with a breathing filter.

BACKGROUND ART

An electronic control device, such as an engine control unit or an automatic transmission control unit, which is mounted under a condition where the unit is directly splashed with liquid such as water, for example, mounted in an engine room, is configured to have a circuit board mounted with electronic parts housed in a protective space (waterproofed space) in a case made up of a plurality of case parts joined. In such an electronic control device, completely sealing a case causes stress to be applied to a harness connected to a connector portion and a waterproof portion at the tip of the harness due to a pressure difference between the inside of the case and the outside air, resulting in making liquid such as water be liable to be drawn into the unit. Therefore, a structure has been provided in which a breathing path is provided at a part of a case member and a breathing filter film having permeability and waterproofness is attached to an end surface of the breathing path (e.g. PTL 1).

CITATION LIST

Patent Literature

PTL 1: JP 2006-49618 A

SUMMARY OF INVENTION

Technical Problem

However, in a conventional structure of an electronic control device, depending on a direction in which the device is mounted on a vehicle, water stays in a breathing filter portion to disable adjustment of a pressure difference between the inside of a case and the outside air, resulting in limiting a vehicular layout. Additionally, since a filter portion is formed in the central part within the case, no electronic part can be mounted on boards below and above the filter portion, resulting in increasing a board size and a case size. Additionally, a cost-up problem is also involved.

Therefore, an object of the present invention is to provide an electronic control equipment less limited than a conventional equipment in terms of an equipment mounting direction.

Solution to Problem

The above-described problem is solved by the invention recited in Claims.

For example, breathing paths are provided in surfaces that sandwich a part to which a filter film is welded at a corner portion of a resin-side case of an electronic control device, and these paths are connected to each other inside the case.

Advantageous Effects of Invention

The present invention enables provision of an electronic control equipment less limited than a conventional equipment in terms of an equipment mounting direction.

BRIEF DESCRIPTION OF DRAWINGS

FIG. 4 shows an expanded view and a sectional view of a relevant part in a filter portion according to Example 4.

FIG. 5 shows an expanded view and sectional views of a relevant part in a filter portion according to Example 5.

FIG. 6 shows an external view, and an expanded view and a sectional view of a relevant part of an electronic control device according to Example 6.

FIG. 7 shows an expanded view and sectional views of a relevant part in a filter portion according to Example 7.

FIG. 8 shows expanded views and a sectional view of a relevant part in a filter portion according to Example 8.

FIG. 9 shows expanded views and a sectional view of a relevant part in a filter portion according to Example 9.

DESCRIPTION OF EMBODIMENTS

Figure 1:
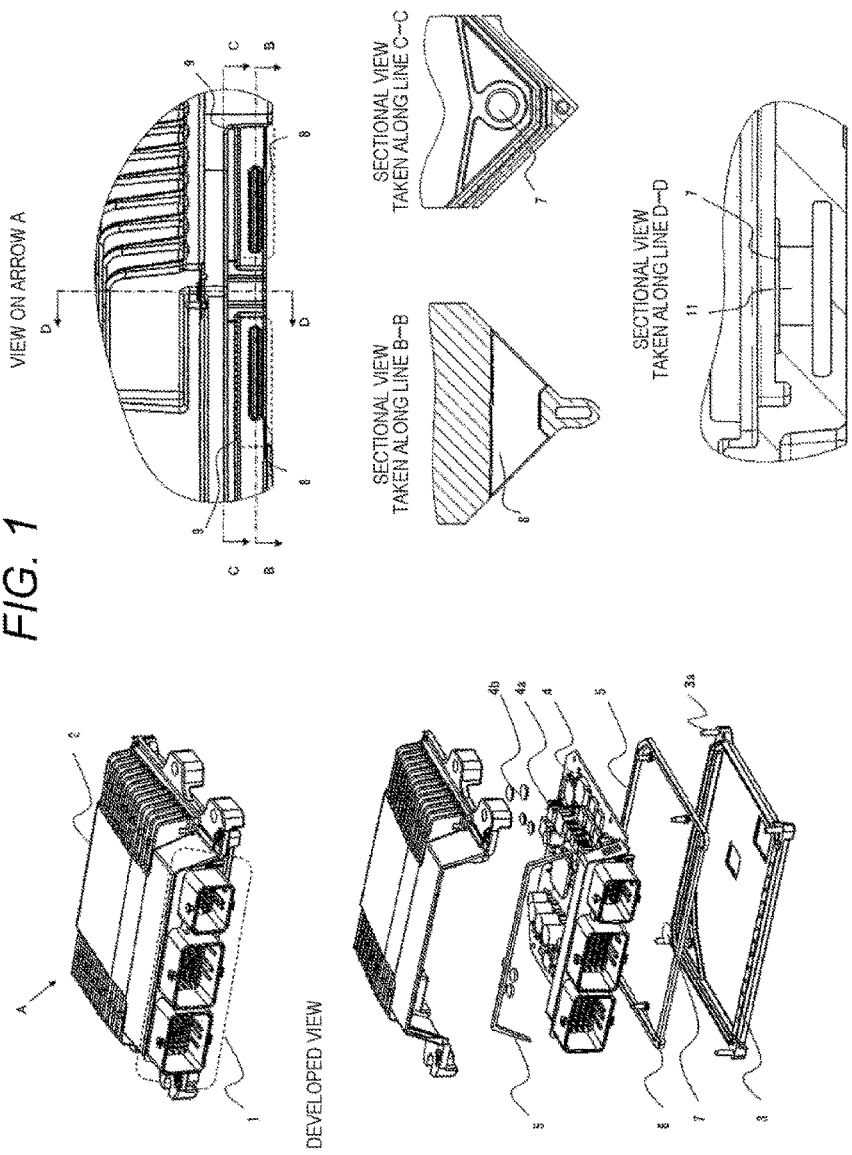
FIG. 1 shows an external view, and an expanded view and sectional views of a relevant part of an electronic control device according to Example 1.

In the following, Examples of the present invention will be described with reference to FIG. 1 to FIG. 4. FIG. 1 shows an external view and developed views of an electronic control device mounted on a vehicle, such as an engine control unit or an automatic transmission control unit, which adopts a structure of the present Example. A view on arrow A is an expanded view of a filter portion seen from the outside, the filter portion being provided at a corner portion of a resin base. Additionally, the sectional views show sections of parts taken along line B-B, line C-C and line D-D, respectively. FIG. 2 to FIG. 5 are expanded views of filter portions seen from the outside, the filter portions having configurations different from each other. FIG. 6 shows an example of an electronic control device having a configuration including a metal base and a resin cover, and shows views of a configuration in which the resin cover is provided with a filter portion.

Figure 10:
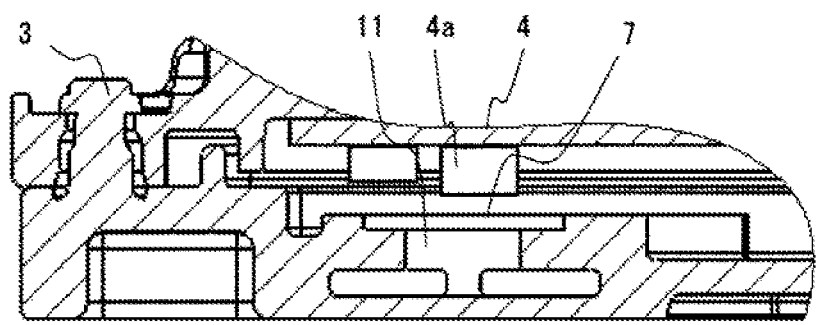
FIG. 10 is a sectional view showing that in a configuration including a metal cover and a resin base, an electronic part and the like can be mounted above a filter portion.
Figure 11:
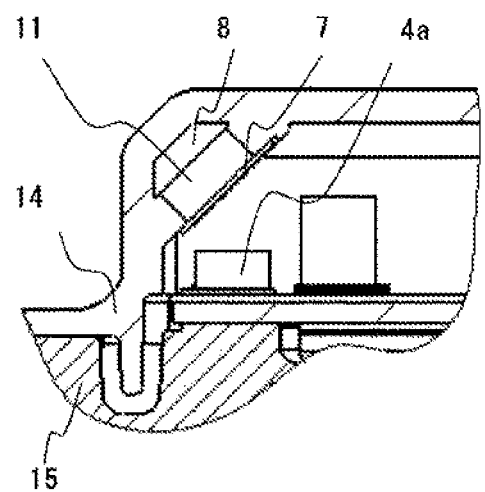
FIG. 11 is a sectional view showing that in a configuration including a resin, cover and a metal base, an electronic part and the like can be mounted above a filter portion.

A view on arrow J is an expanded view of a filter portion seen from the outside, the filter portion being provided at a corner portion of the resin cover. The sectional view is a part of the section taken along line K-K. FIG. 7 to FIG. 9 are expanded views of filter portions seen from the outside, the filter portions having configurations different from each other. FIG. 10 and FIG. 11 are sectional views showing the effect of the present invention that parts can be mounted also on a board below a filter portion.

Embodiment 1

FIG. 1 shows First Example of the present invention.

In the present Example, between an electronic part 4a mounted on a circuit board 4 and a metal cover 2 (die-cast), a heat conductive material 4b is interposed, and the circuit board 4 is fixed to the metal cover 2 by a circuit board fixing screw 6. For maintaining waterproofness of a case, with an adhesive 5 interposed among a connector for external connection 1, the metal cover 2 and a resin base 3, the metal cover 2 and the resin base 3 are joined at heat caulking portions 3a obtained by thermally molding bosses provided at corner parts of the resin base 3. The metal cover 2 and the resin base 3 may be joined by other method such as using a screw or a rivet. At a corner portion of the resin base 3, a breathing filter film 7 is provided. The filter may be provided at any corner portion. Methods of attaching the filter film 7 to the resin base 3 include heat-welding, bonding with an adhesive, adhesion by an adhesive tape, integral molding with the resin base 3, and the like. Breathing paths 8 are opened in surfaces sandwiching a filter portion at the corner portion (breathing path opening surfaces 9) and are connected to each other inside. Below the filter film 7, a breathing hole 11 is provided to communicate with the breathing path 8. In this case, an attachment position of the filter film 7 is set based on a positional relationship between the breathing path 8 and the breathing hole 11 so as not to be seen from the outside in order to prevent high pressure water from splashing the filter film 7. Since the filter film 7 and the breathing path 8 are thin relative to a thickness of the case, the filter portion can be configured to be thin as a whole. Therefore, as shown in FIG. 10, a clearance with the circuit board 4 can be made large to enable the electronic part 4a to be mounted above the filter portion.

Embodiment 2

Figure 2:
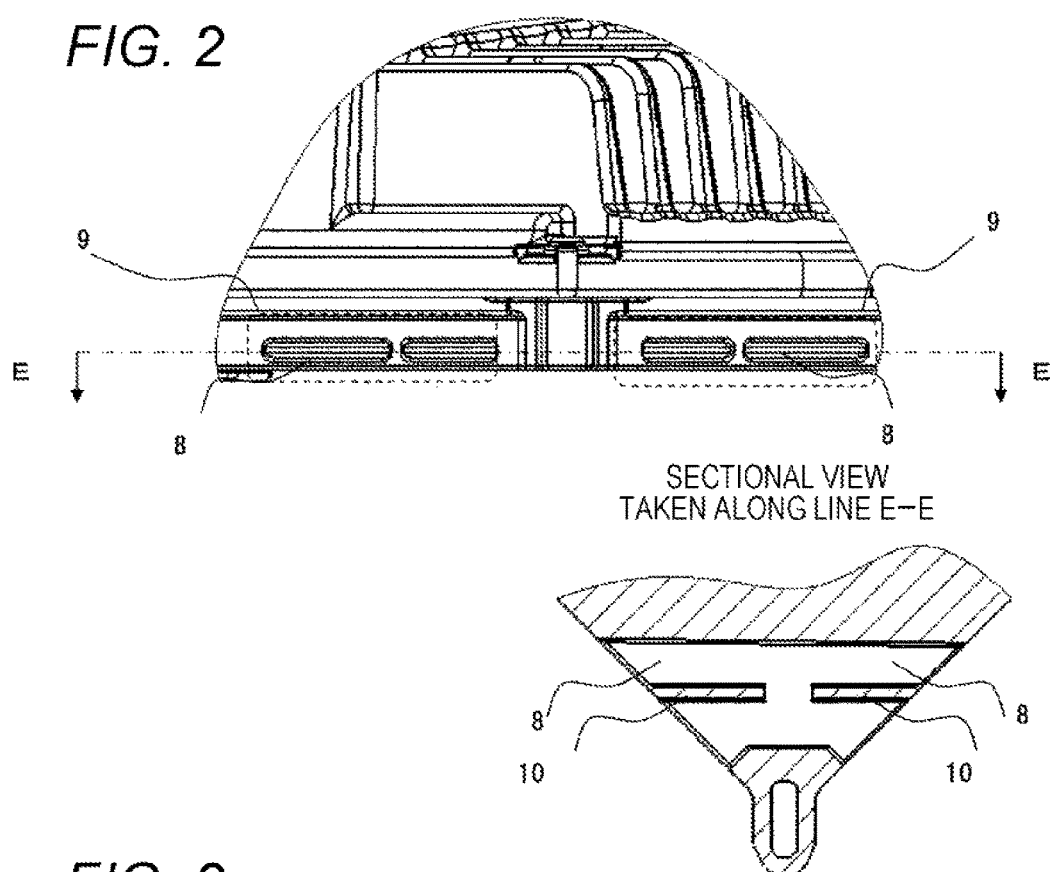
FIG. 2 shows an expanded view and a sectional view of a relevant part in a filter portion according to Example 2.

FIG. 2 shows Second Example of the present invention. As compared with the above Example 1, at least one rib 10 is formed in a breathing path 8 in order to ensure strength. It is necessary to provide the rib 10 because as an opening area of the breathing path 8 is increased, the strength of the filter portion is decreased. In addition to ensuring the strength, the rib 10 serves also as a protective wall for preventing high pressure water from splashing a filter film 7. Similarly to Example 1, since, the filter portion has a small thickness, parts can be mounted also on the board above the filter portion.

Embodiment 3

Figure 3:
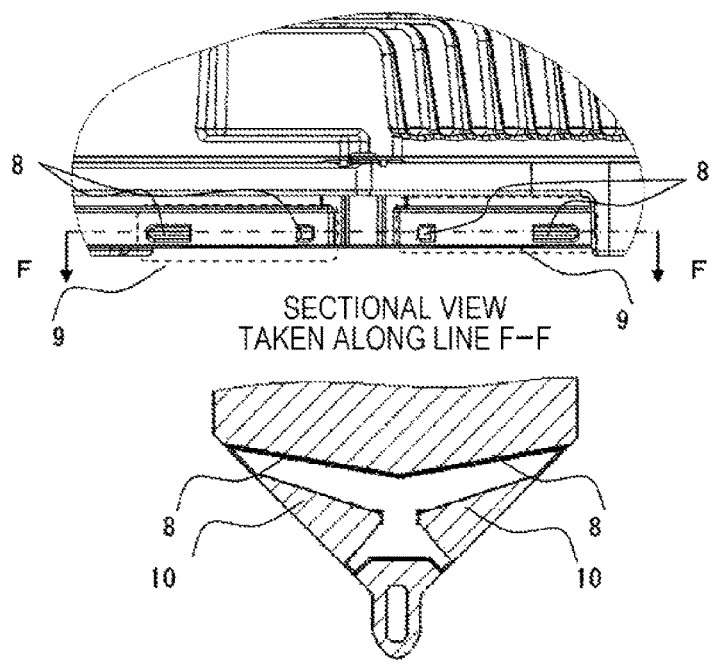
FIG. 3 shows an expanded view and a sectional view of a relevant part in a filter portion according to Example 2.

FIG. 3 shows Third Example of the present invention. As compared with the above Example 2, a rib has a different shape. Similarly to Example 1, the filter has a small thickness to enable parts to be mounted also on the board above the filter portion. Additionally, an opening area of a breathing path 8 of a resin base 3 is decreased to suppress an inflow of high pressure water. Further, since a rib 10 is angled, the force of inflowing high pressure water, which hits against a wall surface, is dispersed to reduce a pressure applied to a breathing filter film 7.

Embodiment 4

FIG. 4 shows Fourth Example of the present invention. As compared with the above Examples 1 to 3, the insides of breathing paths formed in respective surfaces sandwiching a filter portion are angled to cross with each other within a base in order to improve drainability. Similarly to Example 1 to Example 3, the filter has a small thickness to enable parts to be mounted also on a board above the filter portion. Additionally, having an angle 12 facilitates discharging of entering high pressure water at whichever angle the electronic control device of the present invention is arranged.

Embodiment 5

FIG. 5 shows Fifth Example of the present invention. As compared with the above Example 1 to Example 4, a bottom surface of a breathing path of a resin base 2 has a slanting portion 13 in order to improve drainability. In this case, a filter film 7 is set based on a positional relationship between breathing paths 8 and a breathing hole 11 so as not to be seen from the outside in order to prevent high pressure water from, splashing the filter film 7. Similarly to Example 1 to Example 4, the filter portion has a small thickness to enable parts to be mounted also on a board above the filter portion.

Embodiment 6

FIG. 6 shows Sixth Example of the present invention. As compared with the above Example 1, a resin cover 14 and a metal base 15 are used. In the present Example, between an electronic part 4a mounted on a circuit board 4 and the metal base 3, a heat conductive material 4b is interposed, and the circuit board 4 is fixed to the metal base 15 by a circuit board fixing screw 6. For maintaining waterproofness of a case, with an adhesive 5 interposed among a connector for external connection 1, the resin cover 14 and the metal base 15, the cover and the base are joined by heat caulking bosses provided at the four corners of the resin cover 14. The resin cover 14 and the metal base 15 may be fixed by other method such as using a screw or a rivet. In this case, at the corner portion of the resin cover 14, a filter film 7 is provided. The filter may be provided at any corner portion. Methods of attaching the filter film 7 to the resin cover 14 include heat-welding, bonding with an adhesive, adhesion by an adhesive tape, integral molding with the resin cover 14, and the like. Breathing paths 8 are opened in surfaces sandwiching a filter portion at the corner portion and are connected to each other inside. Below the filter film 7, a breathing hole 11 is provided to communicate with the breathing path 8. In this case, the filter film 7 is set based on a positional relationship between the breathing path 8 and the breathing hole 11 so as not to be seen from the outside in order to prevent high pressure water from splashing the filter film 7. Since the filter film 7 and the breathing path 8 are thin relative to a thickness of the case, the filter portion can be configured to be thin. Therefore, as shown in FIG. 11, a clearance with the circuit board 4 can be made large to enable the electronic part 4a to be mounted below the filter portion.

Embodiment 7

FIG. 7 shows Seventh Example of the present invention. As compared with the above Example 6, a first breathing path 8a is opened from a resin cover upper surface 14a toward a metal base 15, a second breathing path 8b is opened in a resin cover side surface 14b so as to be perpendicular to the first path, and both paths cross with each other within a resin cover 14. A breathing hole 11 is formed at a position at which the first and second breathing paths cross with each other and which is on the inner side of the resin cover 14, and further inside, a breathing filter film 7 is provided. In this case, the filter film 7 is set based on a positional relationship between the first and second breathing paths 8a and 8b and the breathing hole 11 so as not to be seen from the outside in order to prevent high pressure water from splashing the filter film 7. Similarly to Example 6, since the filter portion has a small thickness, parts can be mounted below the filter portion and on the board as well.

Embodiment 8

FIG. 8 shows Eighth Example of the present invention. As compared with the above Example 6, in order to improve drainability, at a resin cover upper surface corner portion 14c, breathing paths 8 are provided in a resin cover upper surface 14a and a resin cover side surface 14b and cross with each other within a resin cover 14. The breathing path 8 and a breathing hole 11 cross with each other and a breathing filter film 7 is provided below the breathing hole 11. In this case, the filter film 7 is set based on a positional relationship with the breathing path 8 so as not to be seen from the outside in order to prevent high pressure water from splashing the filter film 7. Similarly to Example 6, since a filter portion has a small thickness, parts can be mounted below the filter portion and on the board as well.

Embodiment 9

FIG. 9 shows Ninth Example of the present invention. As compared with the above Example 8, in order to improve drainability, at a resin cover upper surface corner portion 14c, a first breathing path 8a is formed from a resin cover upper surface 14a toward a metal base 15 and a second breathing path 8b is formed from the outer side of a resin cover side surface 14b toward an inner side of a resin cover 14 so as to cross with each other within the resin base 14. The breathing paths 8a and 8b further cross with a breathing hole 11. A breathing filter film 7 is provided on an inner side of the breathing hole 11 within the resin cover 14. In this case, the filter film 7 is set based on a positional relationship with the breathing path 8 so as not to be seen from the outside in order to prevent high pressure water from splashing the filter film 7. Similarly to Example 6, a filter portion has a small thickness to enable parts to be mounted below the filter portion and on the board as well.

As described in the foregoing, according the present Examples, since water is unlikely to stay in an electronic control equipment irrespectively of a direction, flexibility of layout for mounting the equipment on a vehicle can be increased. Additionally, since arrangement of the filter portion at the case corner portion ensures a clearance between the filter portion and the board, a board fixing structure such as a screw, and an electronic part can be arranged to enable an effect of preventing an increase in a board size to be obtained.

REFERENCE SIGNS LIST 1 connector for external connection
2 metal cover
3 resin base
3a heat caulking portion
4 circuit board
4a electronic part
4b heat conductive material
5 adhesive
6 circuit board fixing screw
7 breathing filter film
8 breathing path
8a first breathing path
8b second breathing path
9 breathing path opening surface
10 rib
11 breathing hole
12 angle
13 slanting portion
14 resin cover
14a resin cover upper surface
14b resin cover side surface
14c resin cover upper surface corner portion
15 metal base

The invention claimed is:

1. An electronic control device mounted on a vehicle, comprising:
a circuit board mounted with an electronic part;
a case covering the circuit board; and
a breathing portion having a filter film disposed between the inside and the outside of the case, wherein
the breathing portion is provided between two surfaces of the case and has a breathing path which connects an opening portion provided in at least either of the two surfaces and the filter film, the breathing path being provided within the case,
wherein each of the two surfaces has the opening portion, and the breathing path communicates with each of the opening portions within the case, and
the case made of resin is a resin base, and a bottom surface of the breathing path of the resin base has a slanting portion.

2. The electronic control device according to claim 1, wherein a rib is provided in the breathing path.

3. The electronic control device according to claim 1, wherein the breathing paths are angled and communicate with each other within the case made of resin.

4. An electronic control device mounted on a vehicle, comprising:
a circuit board mounted with an electronic part;
a case covering the circuit board; and
a breathing portion having a filter film disposed between the inside and the outside of the case, wherein
the breathing portion is provided between two surfaces of the case and has a breathing path which connects an opening portion provided in at least either of the two surfaces and the filter film, the breathing path being provided within the case,
wherein each of the two surfaces has the opening portion,
the breathing path communicates with each of the opening portions within the case,
the case made of resin is a resin cover, and
the breathing path is provided from an upper surface corner portion of the resin cover toward a metal base and communicates with breathing paths in a side surface and a back surface of the resin cover.

5. The electronic control device according to claim 4, wherein the breathing path is provided in the upper surface of the resin cover and communicates with a breathing path in the side surface or the back surface, or in both the side and back surfaces of the resin cover within the resin cover.

6. The electronic control device according to claim 4, wherein the breathing path is provided from the upper surface of the resin cover toward a metal base and communicates with a breathing path in the side surface or the back surface of the resin cover within the resin cover.

\* \* \* \* \*